US008174681B2

(12) United States Patent
Graur et al.

(10) Patent No.: US 8,174,681 B2
(45) Date of Patent: May 8, 2012

(54) CALIBRATION OF LITHOGRAPHIC PROCESS MODELS

(75) Inventors: Ioana Graur, Poughkeepsie, NY (US); Geng Han, Fishkill, NY (US); Scott M. Mansfield, Hopewell Junction, NY (US); Michael Scaman, Goshen, NY (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 12/349,223

(22) Filed: Jan. 6, 2009

(65) Prior Publication Data
US 2010/0171031 A1     Jul. 8, 2010

(51) Int. Cl.
*G03B 27/32* (2006.01)
*G01D 18/00* (2006.01)
(52) U.S. Cl. ............... 355/77; 702/85; 250/252.1
(58) Field of Classification Search ........... 250/252.1; 355/53, 77; 702/85
See application file for complete search history.

(56) References Cited

U.S. PATENT DOCUMENTS

| 2002/0114518 A1* | 8/2002 | Wilt ................. 382/199 |
| 2007/0032896 A1* | 2/2007 | Ye et al. ............ 700/108 |
| 2009/0182448 A1* | 7/2009 | Mansfield et al. ... 700/110 |

* cited by examiner

*Primary Examiner* — Hung Henry Nguyen
*Assistant Examiner* — Michelle Iacoletti
(74) *Attorney, Agent, or Firm* — Katherine S. Brown

(57) ABSTRACT

A method is provided for calibrating a model of a lithographic process that includes defining a parameter space of lithographic model parameters that are expected in an integrated circuit layout. The parameter space is defined according to bin values of a lithographic model parameter that span the range from a predetermined minimum and maximum value of the model parameter. The bin values may be incremented uniformly between the maximum and minimum parameter values, or may be distributed according to a weighting. The lithographic model is calibrated to an initial calibration test pattern. The resulting simulated calibration pattern is evaluated to determine whether the model parameter space is adequately populated. If the parameter space is over or under populated, the calibration pattern is modified until the calibration pattern test values adequately populate the parameter space, so that the final calibrated lithographic process model will more reliably predict images over the full range of image parameters.

10 Claims, 7 Drawing Sheets

CALIBRATION OF LITHOGRAPHIC PROCESS MODELS

BACKGROUND OF THE INVENTION

1. Field of the Invention

The present invention generally relates to semiconductor chip manufacturing, and more particularly to a method for calibrating an optical proximity correction model used for printing a circuit pattern on a semiconductor wafer.

2. Description of the Related Art

Calibration of lithographic process models for simulating images are used in the process of designing masks for use in the manufacture of integrated circuits, for example, in Optical Proximity Correction (OPC) or mask verification procedures has required an increasing number of measurements as the critical dimension tolerances have gotten smaller. The model calibration process may use a combination of image parameters such as slope, Imax, Imin and curvature based on optical parameters as well as perhaps 10 or more density kernels for the resist model.

Calibration against measurement of two dimensional features have been increasing at a faster rate than of features with one dimensional character as the technologies require better accuracy in the lithographic process models for line-end pull-back and corner rounding and for avoiding catastrophic failure which mostly occur due to the non-linearity of processes for two dimensional design structures. However, such measurements of calibration data have typically been performed without a systematic method for determining whether such measurements will contribute to improving the quality of the model predictive capability, and there has been a proliferation of calibration measurement sites without a corresponding improvement in model quality.

Optical Proximity Correction (OPC) uses calibrated optical and resist models to modify the shapes on the mask so that the printed shapes on the wafer will closely match the desired target shapes, within acceptable criteria. OPC optical and resist models are developed through an empirical method using a model calibration process in which test structures (also called calibration structures), that are intended to be a representative set of the actual product patterns, are placed on a test mask. Thus, the calibration test patterns consist of features that have dimensions that are desired to be printed on the wafer. The test mask is then exposed and the wafer image is measured and used as input in the model calibration and building process.

FIG. 1 illustrates a typical lithographic process model calibration procedure according the current art. A lithographic process model, for example, such as a resist model which is intended to predict the threshold image intensity at which a latent image will be formed in the resist, may be expressed as a function of combinations of optical image characteristics, such as Imax, Imin, slope, curvature, and various density kernels, as known in the art. The values of the optical image characteristics are typically obtained from an optical model, such as a Sum of Coherent Systems approximation (SOCS approximation) of the Hopkins integral for describing the optical imaging process. The optical image parameters are then incorporated into a lithographic process model that is used to predict the transferred latent or printed image on a wafer. For example, the lithographic process model for simulating the latent or developed resist and/or etched image may be a polynomial function of such optical image characteristic variables, having coefficients that need to be calibrated.

Calibration test patterns are provided, having measurement test sites at which to compare simulated to printed pattern characteristics, such as critical dimension (CD), edge placement error or other geometric characteristics (Block 101). The calibration test patterns contain features having dimensions and spacings (or pitch) that are systematically varied according to the dimensions and spacings that are expected to occur in the actual circuit design layout. The calibration patterns are transferred to a wafer using the lithographic process that is to be modeled (Block 102). Measurements of the various image characteristics of the transferred calibration pattern at the measurement sites are taken (Block 103). Typically, geometric image characteristics are measured, such as CD, pitch, spacing, edge placement error, and the like.

Next, the lithographic process model coefficients are determined so that the simulated image produced by the lithographic process model adequately predicts the transferred image, within predetermined tolerances or accuracy criteria (Block 104). The process model is calibrated by examining the differences in the simulated images to the measured data obtained from printed images of the calibration test patterns at the measurement test sites. Appropriate adjustments to the process model are made until the differences or "errors" in the predetermined image parameters between the simulated images and the corresponding parameters measured on printed calibration images satisfy certain error metrics or tolerances. This may be done by any suitable method known in the art, such as least squares fitting, and the like.

The resulting final (calibrated) process model (Block 105), typically containing calibrated coefficients in the case of a polynomial model, may be used in the design process with a certain degree of confidence that the simulated mask images will accurately predict the printed images, at least to the extent that the calibration patterns accurately represent the range of patterns that are actually found in the integrated circuit patterns to be manufactured.

Calibration patterns may not represent all pattern variations that occur in the actual circuit layout. For example, referring to FIG. 2A, a calibrated model may provide a simulated contour 211 that matches the target shape 201, within a predetermined tolerance. However, referring to FIG. 2B, the actual printed image 202 has a failure point 205 that was not accurately predicted by the model. One reason for this predictive failure can be seen with reference to FIG. 2C, which illustrates a three-dimensional plot of image parameter space that may comprise a typical process model. In this example, the image parameter space is defined by three image characteristics, specifically, Imax plotted along axis 111, Imin plotted along axis 112, and curvature plotted along axis 113. The calibration image data covers the image parameter space approximately indicated by the region 220. However, the failure point 205 occurs in the image parameter space outside of the region of calibration data 220, thus the process model did not accurately predict the pinched off feature at the failure point 205 in FIG. 2C.

In current calibration methods, new calibration structures are constantly added to existing calibration structures from previous banks of knowledge as new problem areas are found. There is typically no systematic approach to adding or subtracting calibration structures that accounts for whether the parameter space will be adequately covered by the calibration patterns.

In view of the foregoing considerations, there is a need for a calibration method to more reliably ensure that a process model will accurately predict the full range of image characteristics found in the actual circuit layout during the mask design process, for example, in OPC or mask verification methodologies.

SUMMARY OF THE INVENTION

According to one aspect of the invention, a method of calibrating a model of a lithographic process is provided, the method comprising the steps of: (a) providing a lithographic process model comprising a function of combinations of image parameters and coefficients of said combinations of said image parameters; (b) providing a calibration pattern having measurement sites for determining model parameters, said model parameters comprising at least one of said image parameters; (c) determining for at least one of said model parameters a set of bin values of said at least one of said model parameters, said set of bin values defining a parameter space between a minimum parameter value and a maximum parameter value; (d) transferring said calibration pattern in accordance with the lithographic process to form a printed image; (e) obtaining measured values of said at least one of said model parameters at said measurement sites in said printed image; (f) determining values of said coefficients so that a simulated image of said calibration pattern produced by using said lithographic process model provides simulated values of said at least one of said model parameters that match said measured values within a predetermined tolerance; (g) classifying said simulated values of said at least one of said model parameters in accordance with said set of bin values; (h) evaluating whether said parameter space is adequately populated by said classified simulated values; and (i) if said parameter space is not adequately populated, then modifying said calibration pattern and repeating the steps (c) through (i) using said modified calibration pattern until said parameter space is adequately populated.

In an embodiment according to the invention, the model parameters further comprise at least one geometric parameter.

In another embodiment in accordance with the invention, the parameter space is adequately populated if the number of said classified simulated values associated with at least one of said bin values is not statistically significant. In another embodiment, the parameter space may be considered not adequately populated if at least one of said bin values is over or under populated. In another example, the parameter space may be considered over populated if at least one of said bins is associated with more of said classified simulated values than is required to be statistically significant.

In another embodiment in accordance with the invention, bin values are distributed evenly between said minimum parameter value and said maximum parameter value. In one embodiment, bin values may be incremented by 10% of the difference between said maximum parameter value and said minimum parameter value. In another embodiment, bin values may be distributed according to a weighted distribution between said minimum parameter value and said maximum parameter value. In yet another embodiment, if said parameter space is under populated, then said modifying said calibration pattern comprises adding calibration features or measurement sites.

The resulting calibrated lithographic process model may be used in a lithographic design process, such as optical proximity correction or mask verification.

Other objectives, advantages and aspects of the present invention will be more readily understood and made apparent with reference to the following detailed description.

BRIEF DESCRIPTION OF THE DRAWINGS

The invention will be better understood from the following detailed description with reference to the drawings listed below, which are not necessarily drawn to scale.

DESCRIPTION OF THE PREFERRED EMBODIMENTS

Figure 1:
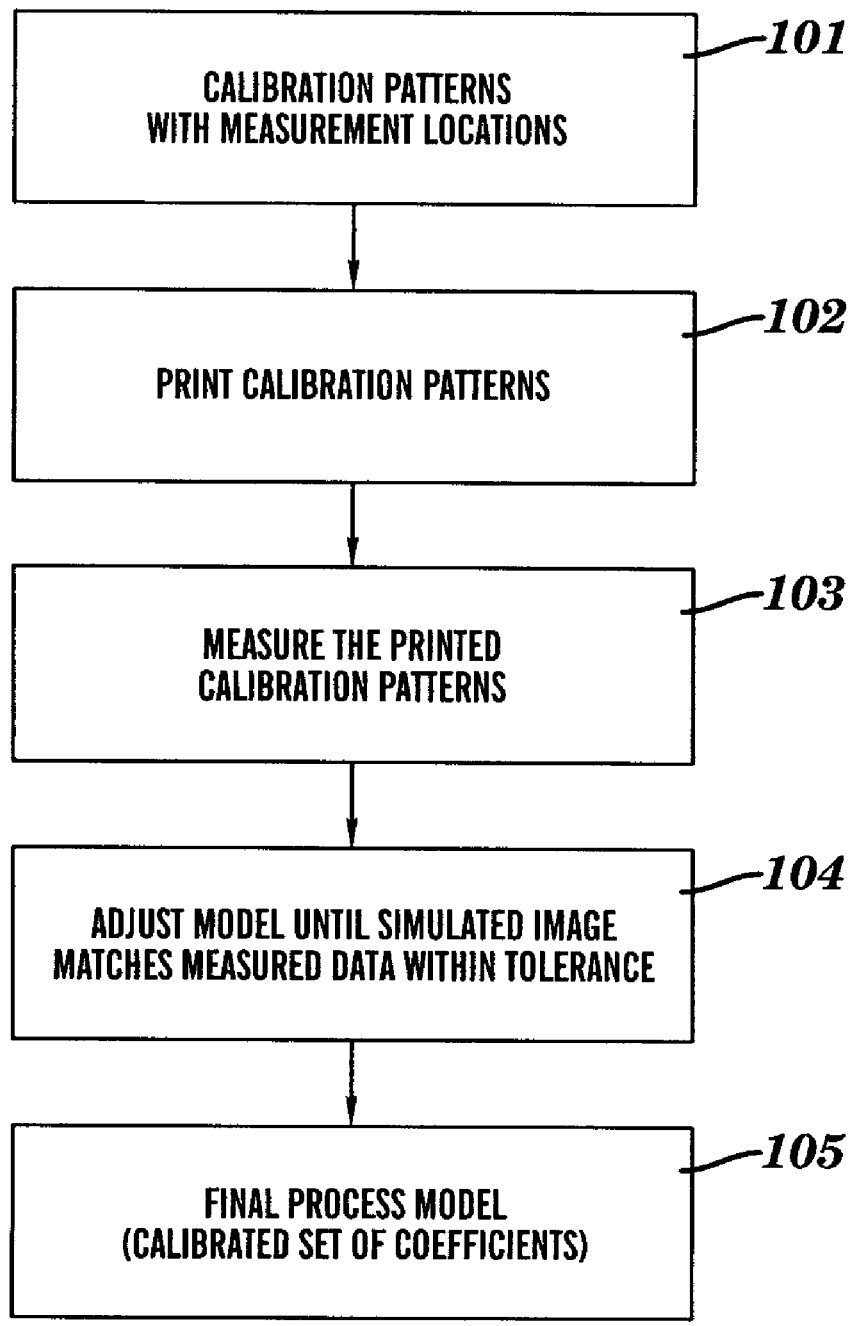
FIG. 1 illustrates a conventional process model calibration method.
Figure 2B:
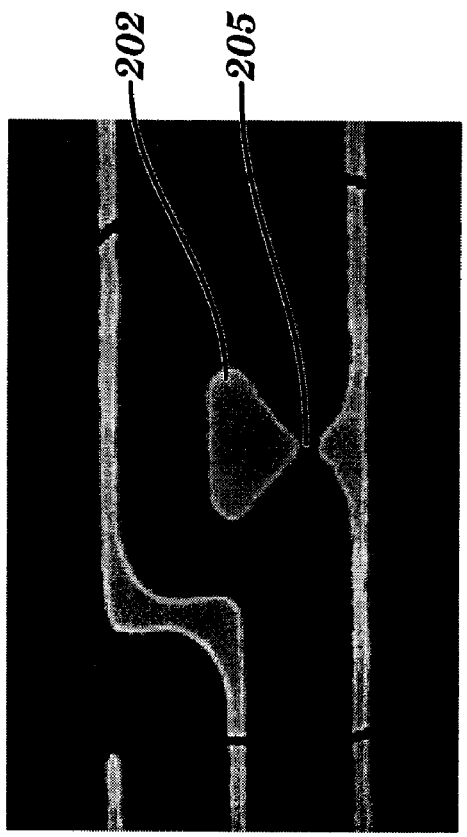
FIG. 2B illustrates an SEM of a printed image.
Figure 2A:
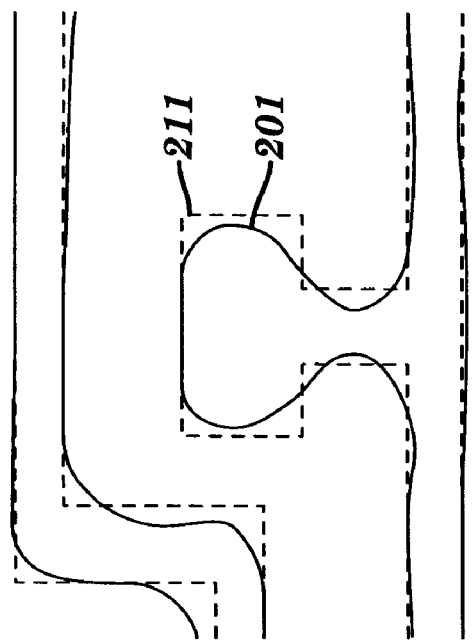
FIG. 2A illustrates a simulated image for a process model calibrated by a conventional method.
Figure 2C:
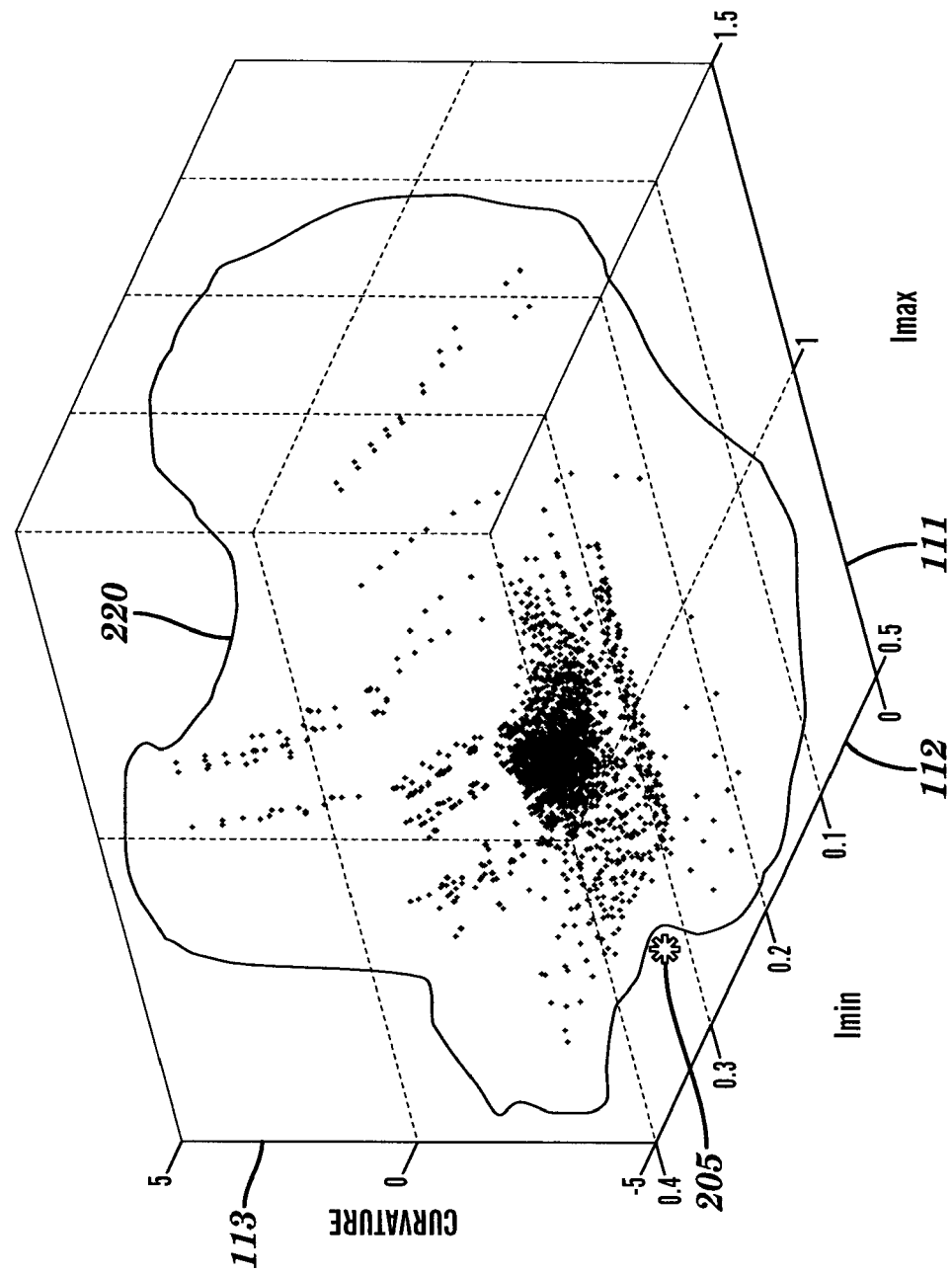
FIG. 2C illustrates an example of plot of calibration data in an image parameter space.
Figure 3:
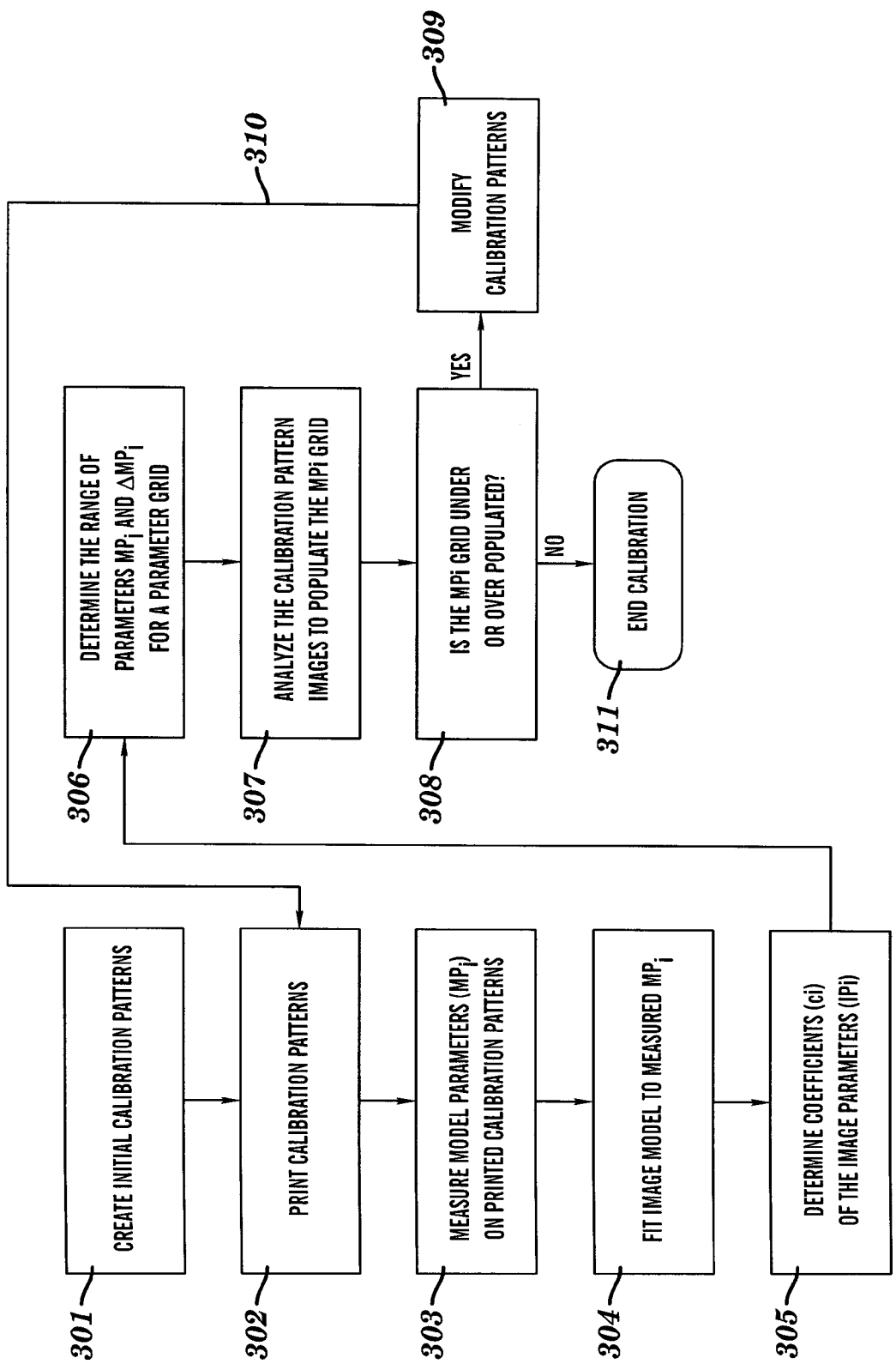
FIG. 3 illustrates an embodiment of a calibration method in accordance with the invention.

An embodiment of a method in accordance with the present invention is illustrated in FIG. 3. An initial calibration pattern, including a variety of features having different geometric and expected imaging characteristics, is provided (Block 301). Typically, associated model parameters will be measured at predetermined measurement sites in the calibration pattern. The calibration features within the calibration pattern may comprise individual features each having fixed characteristics (such as CD, length, spacing, pitch, aspect ratio, tone, and the like) or may comprise features having characteristics that vary within the same feature.

Next, the calibration patterns are printed on a wafer (Block 302).

A typical resist image model of the threshold intensity $I_T$ to be calibrated has a polynomial form such as:

$$I_T = c0 + c1*slope + c2*Imax + c3*Imin + c4*curvature + \\ c5*D1 + c6*D2 + c7*D3 + c8*D4 + c9*D5 + c10*D6 + \\ c11*slope^2 + c12*Imax^2 + c13*Imin^2 + \\ c14*curvature^2 + c15*D1^2 + c16*D2^2 + c17*D3^2 + \\ c18*D4^2 + c19*D5^2 + c20*D6^2 + c21*slope*Imax + \\ c22*slope*Imin + c23*Imax*Imin,$$

where the terms Di refer to image density kernels.

The above equation may be written equivalently as, $$I_T = c0 + c1*MP_1 + c2*MP_2 + c3*MP_3 + c4*MP_4 + \\ c5*MP_5 + c6*MP_6 + c7*MP_7 + c8*MP_8 + c9*MP_9 + \\ c10*MP_{10} + c11*MP_1^2 + c12*MP_2^2 + c13*MP_3^2 + \\ c14*MP_4^2 + c15*MP_5^2 + c16*MP_6^2 + c17*MP_7^2 + \\ c18*MP_8^2 + c19*MPg^2 + c20*MP_{10}^2 + \\ c21*MP_1*MP_2 + c22*MP_1*MP_3 + c23*MP_2*MP_3,$$

and more generally, the imaging or process model to be calibrated may be a polynomial function of appropriate model parameters $MP_i$, such as optical image parameters, and combinations thereof, according to, for example, the process technology and degree of accuracy desired.

In addition, the imaging models must meet various criteria related to the geometrical parameters or characteristics of the image, including, but not limited to, edge placement error (EPE), CD, length, spacing, pitch, aspect ratio, and the like. These geometrical parameters may be related to or correlated with the optical image parameters. Together, the geometric and optical image parameters comprise the model parameters $MP_i$ that must be calibrated to data obtained from the calibration patterns.

In Block 303, measurements of model parameters $MP_i$ are obtained from the printed calibration patterns.

In Block 304, the process model is calibrated ("fitted") by examining the difference in predetermined image parameters in the simulated images from the process model to the measured data obtained from printed images of the calibration test patterns at the measurement test sites. Appropriate adjustments to the coefficients $c_i$ of the process model are made until the differences or "errors" in the model parameters $MP_i$ between the parameters predicted by the simulated images and the corresponding parameters measured on printed calibration images satisfy certain error metrics or tolerances. This may be done by any suitable method known in the art, such as least squares fitting, and the like. This results in an initial calibrated model (Block 305).

In Block 306, the coverage of the measured model parameter $MP_i$ provided by the calibration pattern is determined. The model parameter coverage may be determined by first determining the range that each of the model parameters $MP_i$ are expected to span in the circuit layouts whose images are to be simulated by the process model. For example, the full expected range of a particular image parameter in the circuit layout (e.g. the minimum and maximum expected value of Imax) may be obtained from knowledge and experience of the engineer working in the particular technology and lithographic process being used. Alternatively, such ranges can be obtained by determining the maximum and minimum values of the image parameters for sets of actual circuit patterns formed by a particular lithographic process. Similarly, the expected range of geometric parameters, such as CD, pitch, spacing, etc., may be determined.

Figure 4A:
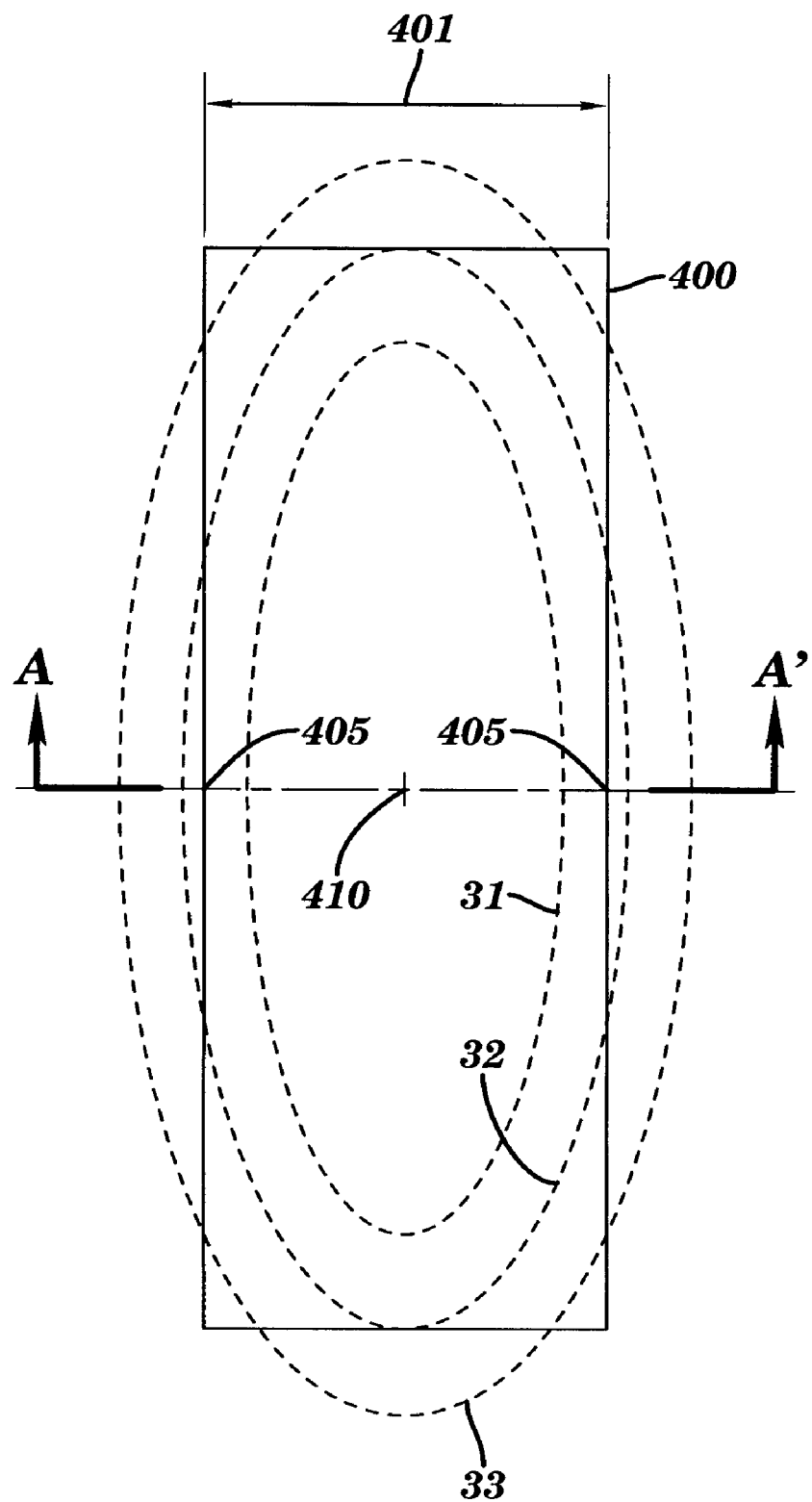
FIG. 4A illustrates a top down view of a calibration pattern and associated simulated image contours.
Figure 4B:
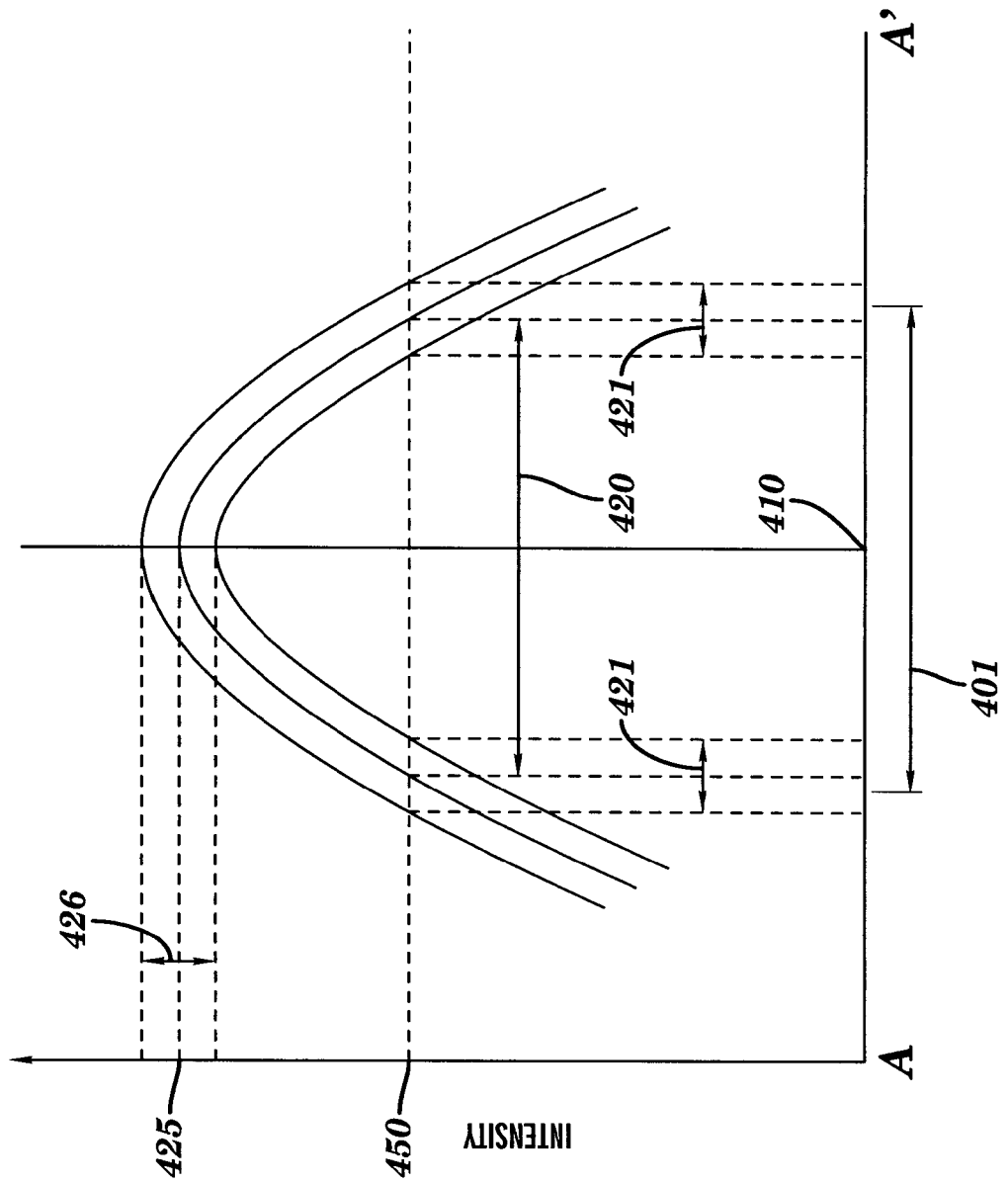
FIG. 4B illustrates a plot of intensity along the line A-A' of FIG. 4A.

In order to ensure coverage of the parameter space, the range of each image parameter is gridded by an increment such that the increment of the image parameter corresponds to a submultiple of the minimum feature size. For example, referring to FIG. 4A, the critical dimension (CD) of a calibration feature 400 to be printed is correlated to the intensity of the feature image, represented by intensity contours 31, 32, 33. The nominal CD 401 is the desired width of the feature 400. The actual printed CD is dependent on the image intensity exceeding a development threshold intensity 450 (see FIG. 4B), which is dependent on the properties of the resist. FIG. 4B illustrates, for a plurality of similar features of the calibration pattern, a plot of intensity versus distance along the line A-A' where CD measurement sites 405 are located, as well as a site 410 for the measurement of Imax (Imax is the maximum intensity in the close vicinity of the measurement site 410). The CD is estimated using a simulation model by determining where the simulated image intensity exceeds the threshold 450.

In accordance with the an embodiment of the invention, a grid or binned model parameter values is determined over the range of image or geometric model parameters that are expected or allowed in the integrated circuit. For example, referring to FIG. 4B, the range of CDs across a chip may range from an expected or allowed minimum CD 421 to an expected or allowed maximum CD, based on factors such as design rules and process variations. The CD values may be correlated or sensitive to variations in another model parameter, such as Imax, which is the maximum intensity in the vicinity of a measurement site 410, 411, may range from an expected or allowed minimum (e.g. a minimum Imax 426) to an expected or allowed maximum (e.g. a maximum Imax 427), based on factors such as resist properties and process variations.

According to a preferred embodiment, the grid or bin intervals are determined by a desired resolution of model parameters $MP_i$ within the range of predetermined minimum and maximum model parameters $MP_i^{Min}$, $MP_i^{Max}$, respectively, that are expected or allowed. For example, the grid increment $\Delta MP_i$ defining the parameter bins may be a percentage of difference between the maximum and minimum parameter values, e.g. 10%, but other image resolution criteria may be used to define the bin increments, and the invention is not so limited. The binned range of a model parameter is used to determine the completeness of coverage for that model parameter by the calibration pattern. In this example, the bin values for CD may range from $CD_{min}$ 421 to $CD_{max}$ 422 by increments of 0.1 $(CD_{max}-CD_{min})=\Delta CD$, assuming an increment resolution of 10% of the CD expected range is adequate for the technology in question. In one embodiment, there may be ten bins or grid increments to cover the range of expected CD values, i.e. CD bins having assigned values of $CD_{min}$, $CD_{min}+\Delta CD$, $CD_{min}+2\Delta CD$, $CD_{min}+3\Delta CD$, $CD_{min}+4\Delta CD$, $CD_{min}+5\Delta CD$, $CD_{min}+7\Delta CD$, $CD_{min}+8\Delta CD$, $CD_{min}+9\Delta CD$, $CD_{min}+10\Delta CD=CD_{max}$. Similarly, the bins for Imax may range from $Imax_{max}$ 426 to $Imax_{min}$ 427 in increments of $\Delta Imax=0.1$ $(Imax_{max}-Imax_{min})$, or Imax ranges from $Imax_{min}$, $Imax_{min}+\Delta Imax$, ..., $Imax_{min}+10\Delta Imax$ in one embodiment. More generally, in one embodiment, the bins for a model parameter $MP_i$ may have values $MP_i^{Min}+n\Delta MP_i$, where $n=0, \ldots, N$ where N (e.g. 10) is the number of increments between the minimum $MP_i^{Min}$ and maximum $MP_i^{Max}$ expected parameter values in this embodiment, and $\Delta MP_i$ is a suitable increment for defining the grid values.

The increment $\Delta MP_i$ need not be uniform, but should represent the desired resolution for the range of values covered. For example, the bin values could be assigned a distribution according to a weighted distribution between the minimum and maximum parameter values, where smaller bin value increments are provided in the range where the model parameter changes most rapidly or is the most sensitive to variations in other model parameters. Larger increments may be provided where the model parameter is expected to vary more slowly as a function of other model parameters.

In Block 307, the coverage of the binned model parameters $MP_i$ is analyzed. The range of the model parameters $MP_i$ covered by the calibration pattern may be determined by simulating the image of the calibration pattern and then determining from the simulated images values of the model parameters $MP_i$ obtained from the image simulated by the calibrated process model. Both optical and geometric model parameters may be determined from the simulated image and classified according to the binned parameters. For example, if a value $MP_i$ (m) that is measured on the printed calibration pattern falls within the range of $MP_i^{Min}+n\Delta MP_i \pm 0.5 \Delta MP_i$, then that value $MP_i$ (m) is assigned to the bin associated with $MP_i^{Min}+n\Delta MP$.

Figure 5:
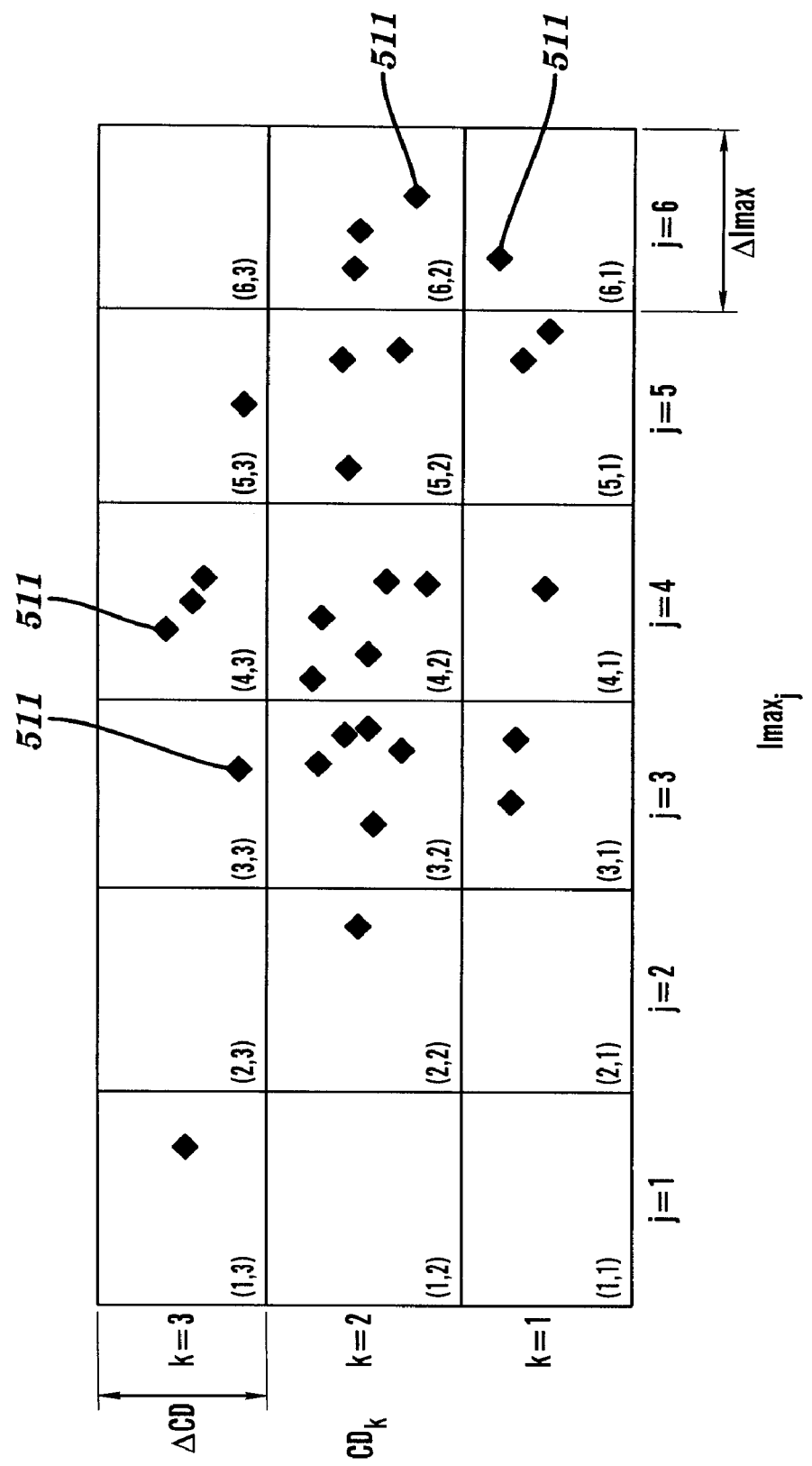
FIG. 5 illustrates an example of a binned parameter space having assigned calibration data in an intermediate step of an embodiment in accordance with the invention.

For example, referring to FIG. 5, a binning of two correlated model parameters CD and Imax are illustrated schematically, showing a portion of a two-dimensional bin for a range of CD and Imax having increments $\Delta CD$, $\Delta Imax$, respectively. A typical parameter space bin is multidimensional, but only a two-dimensional grid or bin is illustrated for clarity. In this example, the parameter space is divided into Imax bins from j=1 to 6, and correlated CD bins from k=1 to 3. Measured data points 511 from the initial calibration set are obtained and assigned to the bins in which the data values 511 fall.

In Block 308, the populated bins are analyzed to determine which data bins may be over or under populated. For example, the bins for values of Imax where j is less than 3, as well as for bins (4,1), (6,1), (5,3) and (6,3) may be considered under-populated. In a preferred embodiment, a bin may be considered under-populated if there are not enough data points classified and assigned to a bin to provide a statistically significant sample size for that bin. Thus, in order to ensure coverage of the calibration data for Imax, additional calibration features and/or measurement sites should be added to more completely populate the parameter bins. By contrast, the bins (3,2) and (4,2) may be considered to be over-populated, or contain more data than may be needed to be statistically significant. In the case of over-population, some of those calibration features and/or measurement sites may be eliminated, which can provide savings not only in simulation time, but also in wafer real estate for the calibration patterns.

Therefore, in accordance with the invention, the calibration patterns are modified (Block 309) so that the calibration features will more completely cover the range of the expected parameter space for model calibration. The modification may be performed by creating or modifying the features to add or subtract selected geometric parameters, and add or subtract certain measurement sites, so that the parameter space is more evenly covered, and thus a more reliable model over the entire range of the expected circuit parameters. For example, additional calibration features may be added, including modifying existing features, so that the measurement sites cover a larger range of expected CDs, pitches and spacing. The modification of calibration features could include adding measurements sites in the existing or new features may be added as appropriate in order to provide additional data to increase the range of parameter coverage in the parameter space. Similarly, certain features and/or measurements sites may be deleted if the parameter space is over populated.

After the modification of the calibration patterns (Block 309), then the process is repeated (310) by printing the modified calibration patterns (Block 302) and fitting the model to the measured data from the modified calibration pattern (Blocks 303-305), populating the parameter space bin and determining whether the coverage of the parameter space is sufficient (Blocks 306-308). In this embodiment, the calibration procedure may be terminated (Block 311) when the parameter space is found to be sufficiently covered by the calibration pattern.

The resulting calibrated process model will more reliably predict the resulting images for an actual circuit layout since the model has been fit to a calibration pattern that covers the full expected range of model.

Other modifications and variations in the invention will be apparent to those skilled in the art from the foregoing disclosure. Thus, while only certain embodiments of the invention have been specifically described herein, it will be apparent that numerous modifications may be made thereto without departing from the spirit and scope of the invention.

The invention claimed is:

1. A method of calibrating a model of a lithographic process, the method comprising the steps of:
    (a) providing a lithographic process model comprising a function of combinations of image parameters and coefficients of said combinations of said image parameters;
    (b) providing a calibration pattern having measurement sites for determining model parameters, said model parameters comprising at least one of said image parameters;
    (c) determining for at least one of said model parameters a set of bin values of said at least one of said model parameters, said set of bin values defining a parameter space between a minimum parameter value and a maximum parameter value;
    (d) transferring said calibration pattern in accordance with the lithographic process to form a printed image;
    (e) obtaining measured values of said at least one of said model parameters at said measurement sites in said printed image;
    (f) determining values of said coefficients so that a simulated image of said calibration pattern produced by using said lithographic process model provides simulated values of said at least one of said model parameters that match said measured values within a predetermined tolerance;
    (g) classifying said simulated values of said at least one of said model parameters in accordance with said set of bin values;
    (h) evaluating whether said parameter space is adequately populated by said classified simulated values; and
    (i) if said parameter space is not adequately populated, then modifying said calibration pattern and repeating the steps (c) through (i) using said modified calibration pattern until said parameter space is adequately populated.

2. The method of claim 1, wherein said model parameters further comprise at least one geometric parameter.

3. The method of claim 1, wherein said parameter space is not adequately populated if the number of said classified simulated values associated with at least one of said bin values is not statistically significant.

4. The method of claim 1, wherein said parameter space is not adequately populated if at least one of said bin values is over or under populated.

5. The method of claim 4, wherein said parameter space is over populated if at least one of said bins is associated with more of said classified simulated values than is required to be statistically significant.

6. The method of claim 1, wherein said bin values are distributed evenly between said minimum parameter value and said maximum parameter value.

7. The method of claim 6, wherein said bin values are incremented by 10% of the difference between said maximum parameter value and said minimum parameter value.

8. The method of claim 1, wherein said bin values are distributed according to a weighted distribution between said minimum parameter value and said maximum parameter value.

9. The method of claim 1, wherein, if said parameter space is under populated, then said modifying said calibration pattern comprises adding calibration features or measurement sites.

10. The method of claim 1, further comprising using said lithographic process model in an optical proximity correction or a mask verification methodology.

* * * * *